United States Patent [19]

Tsang

[11] Patent Number: 4,734,380
[45] Date of Patent: Mar. 29, 1988

[54] MULTICAVITY OPTICAL DEVICE HELD TOGETHER BY METALLIC FILM

[75] Inventor: Won-Tien Tsang, New Providence, N.J.

[73] Assignee: American Telephone and Telegraph Company, AT&T Bell Laboratories, Murray Hill, N.J.

[21] Appl. No.: 866,941

[22] Filed: May 27, 1986

Related U.S. Application Data

[60] Division of Ser. No. 482,964, Apr. 8, 1983, Pat. No. 4,622,671, which is a continuation-in-part of Ser. No. 469,891, Feb. 25, 1983, abandoned.

[51] Int. Cl.$^4$ ........................................... H01L 21/304
[52] U.S. Cl. .......................................... 437/3; 437/51; 437/226; 357/17; 372/44
[58] Field of Search .......................... 156/645; 357/17; 372/44; 225/96.5; 437/3, 5, 51, 226

[56] References Cited

U.S. PATENT DOCUMENTS

| | | | |
|---|---|---|---|
| 3,303,431 | 2/1967 | Fowler | 331/94.5 |
| 3,504,302 | 3/1970 | Fenner | 372/50 |
| 3,918,150 | 11/1975 | Gantley | 29/583 |
| 3,999,146 | 12/1976 | Lang et al. | 331/94.5 M |
| 4,101,845 | 7/1978 | Russer | 331/94.5 M |
| 4,284,963 | 8/1981 | Allen, Jr. et al. | 331/94.5 H |
| 4,306,351 | 12/1981 | Ohsaka et al. | 29/583 |
| 4,337,443 | 6/1982 | Umeda et al. | 372/49 |
| 4,338,577 | 7/1982 | Sato et al. | 372/44 |
| 4,380,075 | 4/1983 | Allen, Jr. et al. | 372/44 |
| 4,558,449 | 12/1985 | Gordon | 372/44 |

OTHER PUBLICATIONS

L. B. Allen et al, "Single Frequency Injection Laser Diodes for Integrated Optics and Fiber Optics Applications", *Proceedings of the Society of Photo-Optical Instrumentation Engineers*, vol. 157, 1978, pp. 110–117.

K. J. Ebeling et al, "Generation of Single-Longitudinal-Mode Subnanosecond Light Pulses by High-Speed Current Modulation of Monolithic Two-Section Semiconductor Lasers", *Electronics Letters*, vol. 18, No. 21, Oct. 14, 1982, pp. 901–902.

M. B. Chang et al, "Amplification in Cleaved-Substrate Lasers", *IEEE Journal of Quantum Electronics*, vol. QE-16, No. 9, Sep. 1980, pp. 997–1001.

L. A. Coldren et al, "Etched Mirror and Groove-Coupled GaIn AsP/InP Laser Devices for Integrated Optics", *IEEE Journal of Quantum Electronics*, vol. QE-18, No. 10, Oct. 1982, pp. 1679–1688.

W. F. Kosonocky et al, "GaAs Laser Amplifiers", *IEEE Journal of Quantum Electronics*, vol. OE-4, No. 4, Apr. 1968, pp. 125–131.

D. Fekete et al, "High-Speed Laser Modulation with Integrated Optical Injection", *Applied Physics Letters*, vol. 37, No. 11, Dec. 1, 1980, pp. 975–978.

F. K. Reinhart et al, "Electro-Optic Frequency and Polarization Modulated Injection Laser", *Applied Physics Letters*, vol. 36, No. 12, Jun. 15, 1980, pp. 954–957.

S. M. A. Hamdy et al, "Comparison of Modal Analysis and Equivalent Circuit Representation of E-Plane Arm of the Jerusalem Cross", *Electronics Letters*, vol. 18, No. 2, Jan. 21, 1982, pp. 94–95.

*Primary Examiner*—Olik Chaudhuri
*Attorney, Agent, or Firm*—Richard D. Laumann

[57] ABSTRACT

Semiconductor lasers having cleaved optically coupled cavities operating electrically isolated produce output of a single longitudinal mode. Wavelength tuning of the single longitudinal mode is possible.

1 Claim, 18 Drawing Figures

MULTICAVITY OPTICAL DEVICE HELD TOGETHER BY METALLIC FILM

CROSS-REFERENCE TO RELATED APPLICATION

This is a division of application Ser. No. 482,964, filed Apr. 8, 1983, now U.S. Pat. No. 4,622,671, which is a continuation-in-part of application Ser. No. 469,891, filed Feb. 25, 1983, now abandoned.

TECHNICAL FIELD

This invention relates generally to semiconductor optical devices and particularly to such devices having optically-coupled cavities that, for example, yield output of a single longitudinal mode when the cavities are appropriately biased and of a wavelength that may be varied by adjusting the current through at least one of the cavities.

BACKGROUND OF THE INVENTION

Optical communications systems as presently contemplated typically use light sources and photodetectors that are optically coupled to each other by means of a glass transmission line which is commonly referred to as an optical fiber. The light source generally contemplated for use in such systems comprises a semiconductor laser diode which has an active layer, i.e., the region in which electron-hole recombination occurs, of relatively small dimensions perpendicular to the direction of radiation emission and which is generally in the form of a stripe. Optical communications systems and components thereof are discussed in *Optical Devices & Fibers*, 1982, edited by T. Suematsu.

For the high data rate communications systems contemplated, narrow spectral output corresponding to single mode operation of the light source is desirable as this minimizes the problems—e.g., limited repeater spacing, relatively low bit rate, etc. (for single channel as well as wavelength multiplexed systems)—that result from the pulse broadening associated with the material dispersion of the glass fiber. It is also desirable in wavelength division multiplexing as it makes possible a reduction in the spectral separations between the different wavelengths employed. Of course, single wavelength operation of a laser diode is desirable for other uses. The term "single wavelength" means a narrow spectral output corresponding to single mode operation.

"Single mode" operation, as originally used by those skilled in the art, meant that under CW operation the secondary modes were suppressed in intensity by a factor of at least 10 with respect to the primary mode. It is now well known that under high speed pulsed modulation, diodes that have single longitudinal mode operation under CW conditions may have an output with significant intensity in an unwanted longitudinal mode, i.e., the longitudinal mode may vary from pulse to pulse. Such diodes are not a solution to the problem of mode stability as they may lead to a significant error rate.

The origin of multiwavelength output from a semiconductor laser may be understood from the following discussion. In a semiconductor laser diode, a single Fabry-Perot cavity of length L is formed between two parallel and usually partially reflecting faces. The Fabry-Perot mode spacing, $\Delta\lambda$, is approximately $\lambda_0^2/2N_{eff}L$, where $\lambda_0$ and $N_{eff}$ are the wavelength of the lasing radiation in air and the effective refractive index of the propagating mode in the laser, respectively. Typical semiconductor laser diodes operate with at least several longitudinal modes because the decrease of the gain of the active medium near the peak of the gain spectrum is not rapid enough to suppress stimulated emission into adjacent modes, i.e., modes other than the primary or most intense mode.

Consequently, the semiconductor lasers presently manufactured generally emit radiation at several wavelengths unless an effort is made to narrow the spectral output to a single mode, i.e., essentially a single wavelength or frequency because the width of the individual modes is extremely narrow. Width means full width at half maximum. Several approaches have been tried in attempts to narrow the spectral output to essentially a single wavelength. One approach to obtaining single wavelength operation from semiconductor laser diodes under CW or high speed modulation is the use of a coupled cavity configuration which can be either external or integrated with the light source.

Single longitudinal mode operation in coupled cavities may be understood by considering the Fabry-Perot mode spacing of the coupled cavity configuration. If the cavities are of significantly different lengths, the coupled mode spacing, $\Lambda$, is approximately equal to that of the shorter cavity and may be increased by further shortening that cavity. If the cavities are approximately equal in length, then:

$$\Lambda = \Delta\lambda_1 \cdot \Delta\lambda_2 / |\Delta\lambda_1 - \Delta\lambda_2| \tag{1}$$

or $$\Lambda = \lambda_0^2 / 2|N_{eff1}L_1 - N_{eff2}L_2| \tag{2}$$

where the subscripts in both equations refer to the first and second cavities, respectively. Thus, the Fabry-Perot mode spacing of the coupled cavities can be increased, and unwanted longitudinal modes suppressed, by having cavities of slightly different lengths. It was generally believed by those attempting to obtain single longitudinal mode operation by use of a multicavity configuration that a critical wavelength matching condition existed which placed restrictions on the lengths of the cavities and the spacing between them so that at least one of the modes of the coupled cavity was located within the gain profile of the semiconductor laser. Satisfaction of such a condition was often believed by those skilled in the art to require precise cavity lengths and intercavity spacing.

Multicavity configurations have been described in the literature. U.S. Pat. No. 4,284,963, issued on Aug. 18, 1981 to Allen et al, described a laser diode that had a predominantly single longitudinal mode output although adjacent longitudinal modes had easily measurable intensity. The laser, which was electrically contacted by single electrodes on both the top and bottom surfaces, i.e., it was a two terminal device, was cleaved perpendicular to the active stripe to form an internal etalon in the cavity. While single longitudinal mode operation was described, the diode was operated under CW conditions and the additional, i.e., the unwanted, longitudinal modes were sufficiently intense to prohibit use of this laser diode in high data rate communications systems. This laser is also described in *Proceedings of the Society of Photo-Optical Instrumentation Engineers*, 157, pp. 110–117, 1978.

Coldren et al described an integrated optical device capable of single dominant longitudinal mode operation in *Applied Physics Letters*, pp. 315–317, March 1981. A high aspect ratio groove was formed in the device by reactive ion etching to form two optically coupling cavities. For single longitudinal mode operation at an arbitrary output level, Coldren et al calculated that cavity lengths within a prescribed regime were required. The intensity ratios disclosed for the primary to secondary longitudinal modes were relatively small and the two sections were electrically connected with a series resistance of approximately 0.5 ohms. Latter work by members of the same group described, for example, as published in *Electronics Letters*, 18, pp. 901–902, Oct. 14, 1982, better results for a device with relative lengths of the two cavities having a ratio of 8:1 and an intercavity spacing of approximately 1 $\mu$m. Although a deep groove separated the cavities, there was a low measurable intercavity resistance. However, the ratio of the primary to the suppressed secondary modes was higher than in the first paper.

It was apparently believed by those skilled in the art that the reactive ion or chemical etching was preferable to cleaving as this technique of forming the cavities guarantees that the active stripes are precisely aligned with respect to each other and that the cavities have the desired dimensions and are precisely spaced with respect to each other. Satisfaction of these conditions guarantees good optical coupling and, furthermore, does not require cleaving the substrate. It was believed that the power transmitted or reflected by the surfaces coupling the cavities was a sensitive function of the intercavity spacing. See, for example, *IEEE Journal of Quantum Electronics*, QE-18, pp. 1679–1688, October 1982. Strong intercavity coupling permitted better control of the longitudinal modes. Further, it was believed by some that better output was obtained when one cavity was much longer than the other cavity. Cavities of approximately equal length produced less clean output.

Additional multisection optical devices formed by cleaving are disclosed in *IEEE Journal of Quantum Electronics*, QE-4, pp. 125–131, April 1968 (Kosonocky and Cornely) and *IEEE Journal of Quantum Electronics*, QE-16, pp. 997–1001, September 1980 (Chang and Garmire). Both devices described in these papers were formed by mounting the single chip on a substrate, and, after scribing, bending to form cleaved mirror surfaces on the diodes. Neither paper reported single longitudinal mode operation. This is understandable because the lasers used were broad area lasers. The active area of the, for example, Chang et al device had a width of approximately 50 $\mu$m. Due to the filamentary nature of semiconductor lasing, i.e., the lasing occurs in filaments less than 10 $\mu$m in transverse dimensions, single longitudinal mode operation was not obtained in such a broad area laser. Additionally, one of the diode surfaces used by Kosonocky et al was intentionally lapped at an angle with respect to the principal axis of the active layer to destroy the Fabry-Perot cavity. Thus, one of the diodes of the Kosonocky et al device never lased.

Other multisection semiconductor laser devices have been described in the literature. For example, U.S. Pat. No. 3,303,431, issued on Feb. 7, 1967 to Fowler, described a broad area laser device suitable for some optical logic circuits. Two broad area semiconductor lasers were aligned end to end, and while the current density threshold was lowered, i.e., the threshold for the laser pair was lower than the sum of the individual laser thresholds, there was reported to be an absence of enhanced mode selectivity. In fact, the output spectrum was predominantly that of one laser with the emission from that laser being amplified by the second laser. Additionally, the only logic operation the device could perform was an AND gate whose operation relied on the observation that the threshold for the laser pair was lower than the sum of the individual laser thresholds.

Several multicavity injection locking devices have been described. U.S. Pat. No. 3,999,146, issued on Dec. 21, 1976 to Lang et al, described yet another multisection semiconductor laser device. The initial optical spiking and relaxation oscillations of the output intensity associated with the pulsed electrical input were suppressed in the disclosed device by injecting a light beam of predetermined intensity and the desired wavelength from a first laser diode into a second semiconductor laser diode. Thus, the longitudinal mode selection believed necessary for injection locking was obtained externally to the second semiconductor laser diode which, according to this disclosure, should not have an effect on the operation of the first laser diode. U.S. Pat. No. 4,101,845, issued on July 18, 1978 to Russer, described both method and apparatus for suppressing relaxation oscillations in the optical pulses when the diode is under modulation by using two separately controllable semiconductor lasers. One laser operated under CW conditions and had a high spectral purity because of external or distributed feedback mechanisms while the other laser was pulse modulated and had poorer spectral purity. The term "spectral purity" refers to the longitudinal mode spectrum with higher purity meaning fewer modes are present at some intensity level. The lasers were desirably optically isolated from each other so that the second laser had no effect on the behavior of the first laser although the reverse was obviously not true. Fekete et al described an integrated device in *Applied Physics Letters*, 37, pp. 975–978, Dec. 1, 1980, which was also an injection locking scheme. The device had a branched waveguide, which also functioned as a light source, with the light going into the laser section. The device was integrated and suppressed the relaxation oscillations of the light output when the device was switched. The essential principle of all injection locking devices is that the injected light lowers the optical amplitude at the beginning of the lasing pulse and increases the damping of the laser output thus suppressing the relaxation oscillations.

Multisection optical devices have been fabricated for still other purposes such as frequency modulation. For example, an article by F. K. Reinhart and R. A. Logan in *Applied Physics Letters*, 36, pp. 954–957, June 15, 1980, described a AlGaAs integrated optical circuit using an electro-optic frequency modulator. The diodes were broad area and the multi-layer structure was epitaxially grown on a (110) oriented GaAs substrate rather than the more commonly used (100) oriented substrate. This permitted the appropriate electro-optic effect to be obtained for frequency modulation. The circuit comprised a laser and an extra-cavity detector which were optically coupled to each other by a passive semiconductor waveguide. The laser and waveguide were coupled by the evanescent electromagnetic field of the radiation in the active layer.

SUMMARY OF THE INVENTION

A device comprising first and second semiconductor laser diode sections that are optically coupled in both directions by spaced cleaved surfaces and means for adjusting the refractive index of said first and second sections relative to each other produces single longitudinal mode operation even under high speed modulation. The second section may be termed "the modulator section." The second section may also be termed "the control section." It has a refractive index that is adjustable. Single longitudinal mode operation may also be obtained in a device comprising a first cavity section comprising a laser, and a second cavity section with means for changing the refractive index of the second section. Both sections are optically coupled to each other in both directions by spaced cleaved surfaces. Adjustment of refractive index permits adjustment of the ratio of the most intense longitudinal mode relative to suppressed longitudinal modes to a value of at least 50 when said device is CW operated. Both diode sections have an active layer with a current injection width less than approximately 20 $\mu$m. The intensity ratio of the desired mode to suppressed modes is desirably at least 50 when the device is CW operated. Satisfaction of this minimum ratio under CW operation is considered descriptive of single mode operation in accordance with this invention. Restrictions on the relative lengths of the diode sections, however, are not necessary for single longitudinal mode operation. In one preferred embodiment, the refractive indices are adjusted by adjusting the currents through at least one of said first and second sections. Both sections may operate above lasing threshold, or the first section may operate above threshold while the second section operates below threshold. In another preferred embodiment, the diodes are coupled through surfaces formed by cleaving a unitary structure. The diodes are spaced from each other by a distance sufficient to prevent the tunneling of carriers, for example, electrons, between the sections and less than 10 $\mu$m. Within this range, the precise spacing is not critical. In yet another preferred embodiment, frequency modulation of the single longitudinal mode output is obtained.

DETAILED DESCRIPTION

Figure 1:
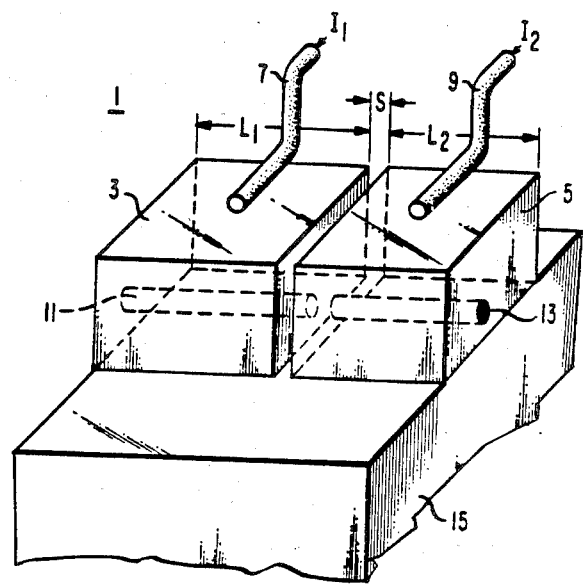
FIG. 1 is a perspective view of a device according to this invention.

One embodiment of this invention is depicted in a perspective view in FIG. 1. The device, indicated generally as 1, comprises a first laser diode section 3, a second laser diode section 5, and electrical contacts 7 and 9 to sections 3 and 5, respectively. The active stripes of sections 3 and 5 are indicated as 11 and 13, respectively. The diode sections are disposed on substrate 15. The diode sections 3 and 5 have physical lengths $L_1$ and $L_2$, respectively, and are separated, i.e., spaced, from each other by a distance, S. The means for adjusting refractive index alters the effective length. All four facets of the diode sections in the embodiment depicted are cleaved surfaces and are essentially parallel to each other. In this and other FIGURES showing device embodiments, the elements of the device are not drawn to scale for reasons of clarity.

Figure 2:
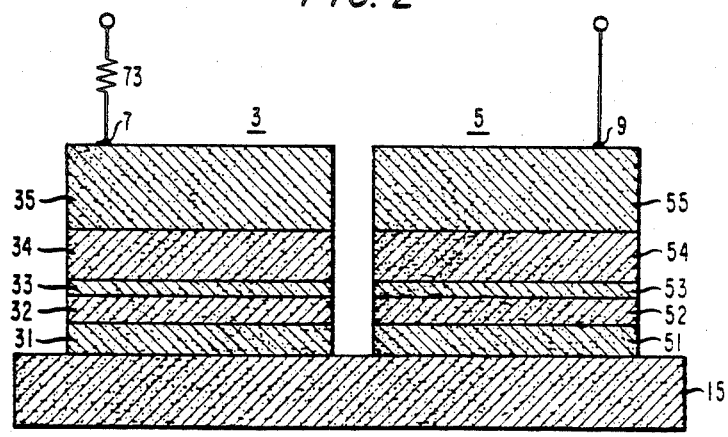
FIG. 2 is a cross-sectional view through the active layer of a device according to this invention.

A cross-sectional view of the embodiment of FIG. 1 through the active layers is shown in FIG. 2. Section 3 is a laser heterostructure that comprises a first layer 31, a first cladding layer 32, active layer 33, second cladding layer 34, and layer 35. Section 5 comprises first layer 51, first cladding layer 52, active layer 53, second cladding layer 54, and layer 55. Further, there is a built-in p-n junction in the active layer in each section. The active layer, i.e., the region in which electron-hole recombination occurs, has a first bandgap energy and a first refractive index. The active layers have a width through which current is injected that is less than 20 $\mu$m to prevent multifilament lasing, i.e., the active layers have a width less than 20 $\mu$m. The cladding layers have a second bandgap energy which is greater than the first bandgap energy and a second refractive index which is less than the first refractive index. The cladding layers thus provide both carrier and optical confinement for these sections which are index guided. Both sections 3 and 5 are disposed on substrate 15. Sections 3 and 5 are electrically contacted by electrode 7 and 9, respectively, and there is further a circuit element, such as variable resistance 73, which permits the current through section 3 to be adjusted relative to the current of section 5. Variable resistance 73 thus provides means for adjusting the refractive index of the first and second sections relative to each other. The substrate 15 forms a common electrical contact to sections 3 and 5. The electrical contacts to sections 3 and 5 may also be used to adjust the current through the two sections. Although the active layers are depicted as being closer to the substrate than to the top surface, they may also be positioned the latter way, i.e., closer to the top surface. All the layers are epitaxially grown and are approximately lattice matched to each other. A variable resistance may also be connected to section 5. Further, laser heterostructures other than the one described may also be used and other means for adjusting the refractive index of the first and second sections relative to each other may also be used. Other index guided structures may also be used. Additionally, the layer structures, materials, doping types and concentrations in sections 3 and 5 may differ. There need be only one laser diode in the device. The second or modulator section need not lase during operation and, in some embodiments, may even be incapable of lasing operation.

The optical cavities are mutually optically coupled to each other through cleaved mirror surfaces, that are formed as described below, and the active stripes are aligned with respect to each other, i.e., the stripes are positioned essentially co-linearly with respect to each other, and separated by a relatively small distance, typically less than about 10 µm, but greater than the carrier tunneling distance, thus providing electrical isolation between the sections. This, i.e., the carrier tunneling distance, is approximately 200 Angstroms for electrons in InGaAsP. The optical cavities are formed by the active layers and extend between the cleaved mirror surfaces. The term "mirror" is used throughout this description in a manner conventional to experts in the laser art. The term suggests reflection—in this instance, partial reflection—of radiation. A "mirror" need not be silvered or otherwise coated but, as in the instance of an uncoated cleaved surface—air interface, may depend simply on a difference in index of refraction to cause partial reflection.

The sections should be electrically isolated from each other, i.e., they should be capable of being electrically biased relative to each other. This facilitates separate control of the carrier concentrations in the two sections.

The compositions of the layers and substrate are not critical, although the layers and the substrate should be at least approximately lattice matched to each other, and may be selected from the group consisting of Group III-V and Group II-VI compound semiconductors. These compositions, for example, InGaAsP, permit the wavelength of the emitted radiation to be in the wavelength range between approximately 1.1 µm and approximately 1.7 µm. This is the wavelength range that is presently of greatest interest for optical communications.

Embodiments other than the one described are contemplated. For example, the device may comprise a first cavity section comprising a laser and a second cavity section which need not be a laser. Both sections are optically coupled in both directions by spaced cleaved surfaces. The device further comprises means for changing the refractive index of at least one section to increase the ratio of the most intense longitudinal mode to suppressed longitudinal modes. A ratio of 50 or more when said device is CW operated has been founded sufficient to avoid instability due to transients for a pulse repetition rate of 420 mbits/sec. The means for changing refractive index comprises, for example, means for adjusting the current or means for adjusting the bias.

Figure 3:
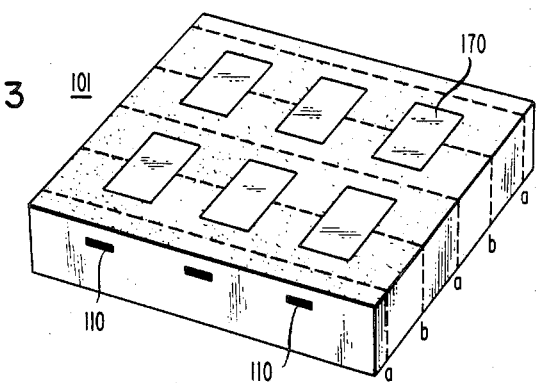
FIGS. 3-6 illustrate steps in the fabrication of devices according to this invention.
Figure 4:
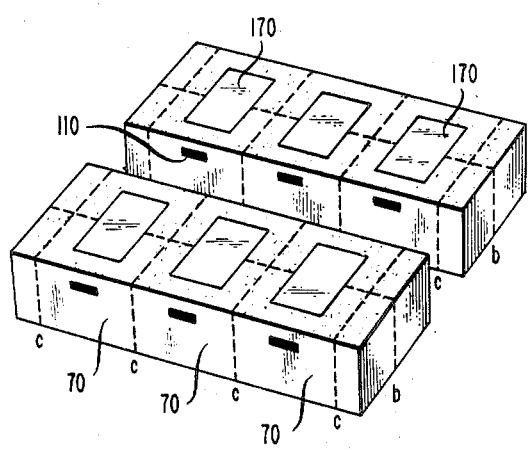
Figure 5:
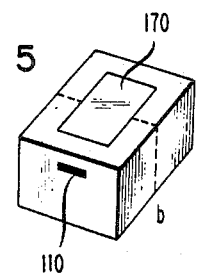

FIGS. 3-6 illustrate an exemplary method for forming devices comprising coupled cavities from a unitary structure according to this invention. FIG. 3 shows a standard semiconductor laser wafer, indicated generally as 101, having a plurality of active stripes 110 and a plurality of gold pads 170 which are formed by, for example, electroplating. The precise structures of the active layers and adjacent layers are not critical and they may be buried heterostructures, buried crescent heterostructures, ridge waveguide laser, or yet other types. The desired layers may be grown on the substrate by growth techniques, such as molecular beam or liquid phase epitaxy, that are well known to those skilled in the art. However, the isolated thick gold pads should preferably be approximately the same size as the standard diode and are electroplated onto the wafer side having the epitaxial layers, if the diode is CW bonded epitaxial layer (epilayer) side down, or onto the substrate side, if the diode is bonded epilayer side up. Other deposition techniques, such as evaporation, may also be used. Metals other than gold may be used if they adhere to the semiconductor and may be plastically deformed. The standard and well-known cleaving procedures are now applied at the positions indicated as a and b. At the positions indicated as a, the bars separate from each other as these positions are not contacted by the gold pads. However, at the positions indicated as b, the presence of the gold pad holds the adjacent cleaved bars together. The lengths ab and ba are not critical and can be selected as desired. FIG. 4 illustrates the resulting structures. The individual pairs 70 of diodes, which are still held together by the gold pads, are now separate from each other by sawing or scribing along positions c. The resulting structure of a single pair of laser diode sections is illustrated in FIG. 5 which shows two precisely self-aligned and extremely closely optically coupled Fabry-Perot cavities. The mirrors of the cavities are formed by the cleaved surfaces.

Figure 6:
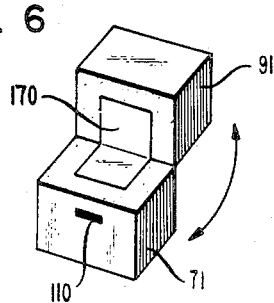
Figure 7:
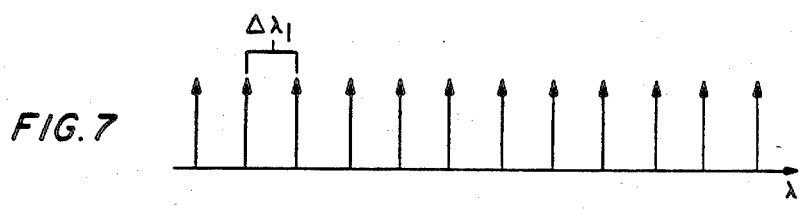
FIGS. 7-9 show the allowed Fabry-Perot modes for both the individual diodes and the optically coupled cavity for devices according to this invention.

A typical separation of the coupled cavities is approximately 1 µm. If a larger separation for the pad linked structure is desired, it can be easily obtained by, for example, moving the two Fabry-Perot diodes with respect to each other using the gold pad as the hinge, thereby physically deforming (lengthening) the pad. This process is illustrated in FIG. 6 with the arrow illustrating the relative movement of the two cavities 71 and 91. The precise separation is not critical but it should be greater than the carrier tunneling distance and less than approximately 10 µm. Of course, the last movement should place the mirror faces parallel or approximately parallel to each other so that the active stripes are aligned with respect to each other. The mirror faces need not be precisely parallel to each other as the angular distribution of the emitted radiation is sufficiently broad to optically couple the cavities. However, the faces should not contact each other, as electrical isolation between the sections is desired. Further, the Fabry-Perot diodes may be slightly twisted with respect to each other with the active stripes forming the twist axis. This twist has a transverse mode filtering effect, i.e., certain transverse modes can be suppressed. It is also easily understood by those skilled in the art that the above-described cleaved-and-hinged-by-the-pad technique can also be applied to forming any other cleaved self-aligned devices or device circuits, for example, a cleaved Fabry-Perot laser diode or a cleaved coupled cavity laser separated but self-aligned with further devices or device circuits originally formed on the same substrate.

To complete the fabrication of the device illustrated in FIGS. 1 and 2, the two Fabry-Perot diodes hinged together by the gold pad as illustrated in FIG. 5 are bonded, using, e.g., indium, simultaneously epilayer side down on a heat sink, such as gold plated copper. Standard CW bonding procedures may be employed. Separate electrical connections are made to each diode on the substrate side. Of course, if the gold pads are on the substrate side, the Fabry-Perot diodes are bonded simultaneously substrate side down, respectively, and the separate electrical connections are made on the epilayer side.

Use of the gold bonding pads is not essential. For example, the laser diode sections may be formed by cleaving a standard wafer without bonding pads and then positioning the diodes with respect to each other on the heat sink and bonding. However, the use of the gold pads facilitates relatively accurate positioning of the active stripes with respect to each other.

Figure 10:
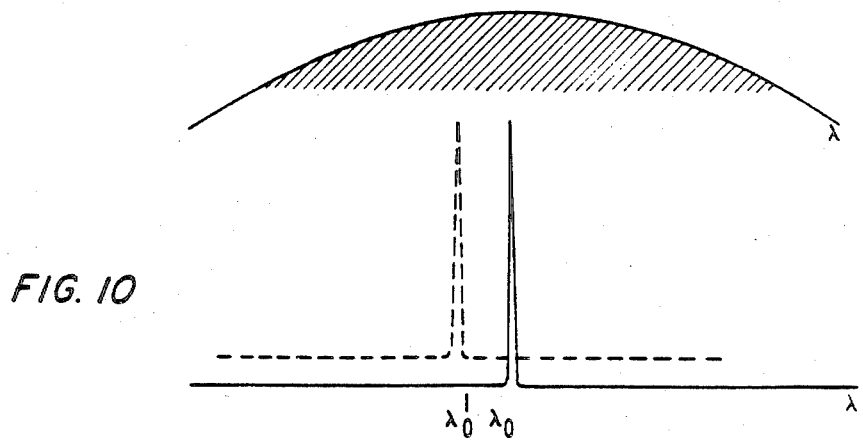
FIG. 10 shows the gain profile of the laser medium and the resultant laser spectrum for a device according to this invention.

The operation of devices according to this invention may be better understood by reference to FIGS. 7-10. The allowed Fabry-Perot modes are shown for laser diode sections 1 and 2 by the solid lines in FIGS. 7 and 8, respectively. The propagating modes in each active stripe can have a different effective refractive index $N_{eff}$ even though the stripes have the same geometric shape, size, and material composition. This is true because $N_{eff}$ is a function of the carrier density in the active stripe and this is a function of, for example, the injection current below threshold when the junction voltage is not saturated. Thus, varying the current through one section will enable one to adjust the refractive index of the first and second sections relative to each other. The currents through both sections may be separately varied. Of course, the sizes of the stripes in each cavity will generally differ. Thus, the Fabry-Perot mode spacings for the two cavities are different and are given approximately by:

$$\Delta\lambda_1 \approx \lambda_0^2/2N_{eff1}L_1 \quad (3)$$

and $$\Delta\lambda_2 \approx \lambda_0^2/2N_{eff2}L_2, \quad (4)$$

for cavities 1 and 2, respectively. The two cavities are mutually optically coupled to each other and those Fabry-Perot modes from each cavity that spectrally coincide will interfere constructively and become the reinforced Fabry-Perot modes of the coupled cavity resonators while the other modes interfere destructively and are suppressed. The allowed modes for the coupled cavity are shown by the solid lines in FIG. 9 and are spaced from each other by a spectral separation of $\Lambda$. The spectral spacing of the reinforced modes is significantly larger than either of the original individual Fabry-Perot mode spacings as is evident from FIG. 9 and depends on the difference between $N_{eff1}L_1$ and $N_{eff2}L_2$. The spacing, $\Lambda$, is given by the approximate equation $\Lambda = \lambda_0^2/2|N_{eff1}L_1 - N_{eff2}L_2|$ where it is assumed that $\Delta\lambda_1$ is approximately equal to $\Delta\lambda_2$. Thus, for the reinforced mode near the gain maximum, the normal gain roll-off is sufficient to suppress the adjacent reinforced modes even under high speed direct modulation as is shown in FIG. 10 in which the solid line illustrates the resulting laser mode spectrum. Thus, varying the refractive indices of the two sections relative to each other by, for example, varying the currents through the sections produces single mode operation with the intensity ratio of the primary, i.e., the most intense, mode to the suppressed modes being at least approximately 50. It is to be understood that $N_{eff}$ for one or both sections may be varied to obtain the desired output. Both sections may operate above lasing threshold. Alternatively, the first section may operate above threshold while the second or modulator section operates below threshold.

The intensity ratio of the primary mode to the secondary longitudinal modes is desirably at least 50 under CW modulation. Satisfaction of this condition permits the high bit rate operation in optical communications systems employing diispersive fibers with an extremely low error rate, for example, less than one bit error in $10^9$ bits, that is desired for high data rate optical communications systems. The low error rate is easily understood by recalling that the stronger modes require a longer time to damp in intensity than do the weaker modes and satisfaction of this condition ensures that the secondary modes are weak and hence damp with great rapidity. It should also be recalled that, upon application of a current pulse, most of the optical power generated appears in a single longitudinal mode and not in the secondary modes. It is thus statistically unlikely that one of the secondary modes has most of the optical output intensity.

Figure 11:
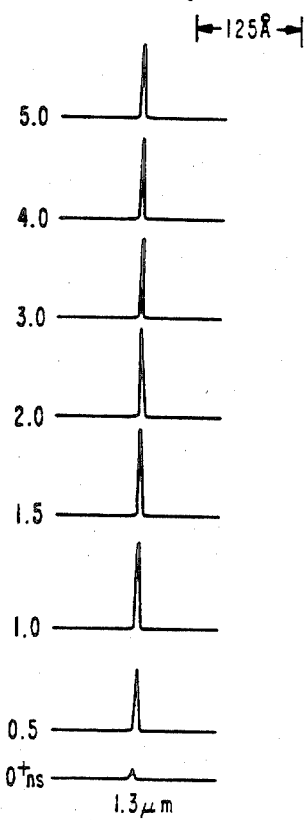
FIG. 11 shows the laser output intensity as a function of wavelength with the wavelength being plotted horizontally and the optical output intensity being plotted vertically with the different curves showing the output for different elapsed times in nanoseconds.

The time resolved transient mode spectrum of an InGaAsP buried cresent laser of the coupled cavity type described is shown in FIG. 11 with the wavelength being plotted horizontally and the laser output power intensity vertically in arbitrary units. The spectra are shown for various elapsed times by the individual curves with the elapsed time being indicated on each curve. The lasers were InGaAsP buried crescent lasers such as those described in *Electronics Letters*, 18, pp. 95-96, 1982. The first diode was pulsed with 50 mA and 500 nsec pulses and the second diode was pulsed with 28 mA and 20 nsec pulses having a 1 nsec rise time. The optical output for the coupled diodes was detected from the second diode. The elapsed time is measured from the onset of the light pulse resulting from the application of an electrical pulse to the second diode. The first diode can also be biased with direct current or a direct current plus a pulsed current. The second diode may also be biased with a direct current plus a pulsed current. It is apparent from the spectra of FIG. 11 that the output power is concentrated in a single longitudinal mode at the onset of the optical pulse and remains in the same longitudinal mode when biased with high speed current pulses.

Figure 8:
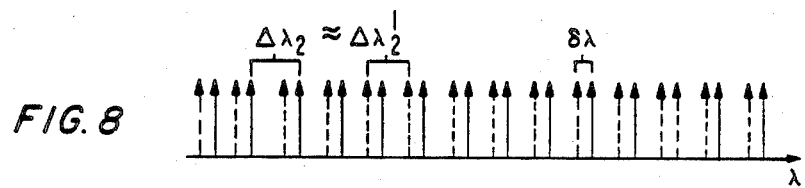
Figure 9:
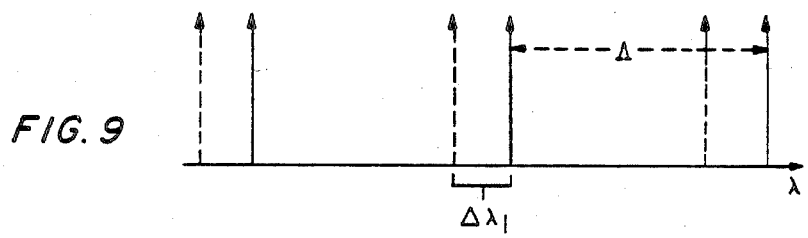

One can also now understand how relatively wide range direct frequency modulation may be achieved in devices of this invention. Assume that the first laser diode is biased with an injection current level $I_1$ above lasing threshold and it thus acts as a laser. Assume that the second laser diode is biased with a current $I_2$ below threshold and it thus behaves as an etalon 2. Under these operating conditions, the mode spectra are described by the solid line in FIGS. 7-10. However, if $I_2$ is now increased to a value $I_2'$ while $I_1$ is kept constant, the resulting change in the carrier density in the active stripe of the second laser diode section will correspondingly induce a decrease in effective refractive index from $N_{eff2}$ to $N_{eff2}'$. The result is a shift of magnitude $\gamma\lambda$ in the modes of laser 2 toward shorter wavelengths. The dashed lines of FIG. 8 show the new allowed Fabry-Perot modes of laser 2. As a result of these changes in current and thus refractive index, the Fabry-Perot modes from laser 1 and etalon 2 that originally coincided are now misaligned and the adjacent mode on the shorter wavelength side comes into coincidence and becomes reinforced instead. This is shown by the dashed lines in FIG. 9. Thus, a shift by one Fabry-Perot mode spacing, $\Delta\lambda_1$, of the laser toward shorter wavelengths occurs. Since the change in $N_{eff2}$ necessary to shift the next adjacent modes into alignment is small, only a small change in $I_2$ is sufficient to obtain such large frequency modulation. The dashed line in FIG. 10 illustrates the resulting laser mode spectrum after $I_2$ is changed.

It is also possible to have the second laser diode biased with a current $I_2$ above threshold and still accomplish frequency shifting by changing $I_2$. This is made possible by designing the second laser diode so that at lasing threshold and above, the carrier density in the active stripe does not pin at a fixed value. That is, at lasing threshold and above, the additional carriers injected into the active stripe do not all go into producing stimulated emission, but a portion of them still continues to contribute to increasing the carrier density and hence continues to induce changes in the $N_{eff2}$. Such a laser diode, for example, can be produced by having nonuniform material properties for the active stripe.

The size of the frequency shift is greatly enhanced by the necessity to jump at least one discrete Fabry-Perot mode spacing of the first laser. This is approximately 15 Angstroms for an approximately 135 $\mu$m InGaAsP cavity operating at approximately 1.3 $\mu$m. It is approximately 20 Angstroms for an approximately 135 $\mu$m InGaAsP cavity operating at approximately 1.5 $\mu$m. A further increase in $I_2$ continues to shift the lasing mode of the coupled cavity to the next Fabry-Perot mode of the first laser. This mechanism thus results in a very large frequency tuning rate, for example, 10 Angstroms/mA, and a very wide frequency tuning range. The range is typically at least half the spectral width of the gain profile which is greater than approximately 150 Angstroms. If the carrier density in the active stripes continues to increase above lasing threshold due to nonpinning of the junction voltage, frequency tuning can be obtained above lasing threshold. In addition to the frequency tuning, it should also be noted that the laser is also operating in a highly stable single longitudinal mode even under the direct high speed direct frequency modulation.

Figure 12:
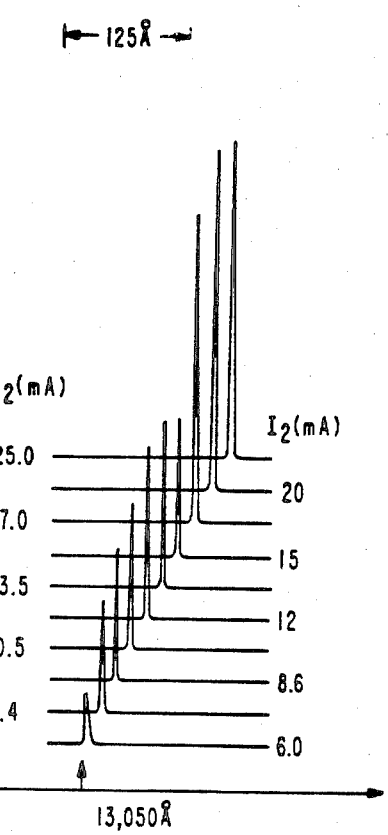
FIG. 12 shows the frequency tuning obtained for a device according to this invention with the wavelength being plotted horizontally and the output being plotted vertically with the different curves showing the output for different currents through the second section of the laser as indicated on the lines.

FIG. 12 shows the various spectra obtained with different current levels applied to the second or modulator laser diode section. The lasers were InGaAsP buried crescent lasers such as those described in *Electronics Letters*, 18, pp. 95–96, 1982. The wavelength is plotted horizontally and the laser output power intensity is plotted vertically with the magnitude of the current through the second diode being indicated on each spectrum. The first laser diode was biased with a 48 mA current pulse of 500 nsec duration. This value is approximately 1.3 times the threshold of the diode when no current is applied to the second diode. The current threshold of the second diode alone was 30 mA. The total threshold with both diodes pumped together was approximately 46 mA. The second laser diode was biased with current pulses having amplitudes below threshold, e.g., 30 mA, and a 700 nsec duration. Different current pulse amplitudes produce laser output radiation at different wavelengths as shown in FIG. 12. It should be understood that dc currents may be applied to either or to both diodes in addition to the current pulses. It is apparent from the output curves shown in FIG. 12 that a frequency shift corresponding to a wavelength shift of approximately 150 Angstroms is obtained as the current through the second laser diode section is varied from 6.0 mA to 25.0 mA.

Devices according to this invention may also be used to perform logic operations optically. The logic devices in this embodiment preferably operate on electrical input signals and produce optical output signals. This is in contrast to optically bistable devices which operate on optical inputs and produce optical outputs.

Figure 13:
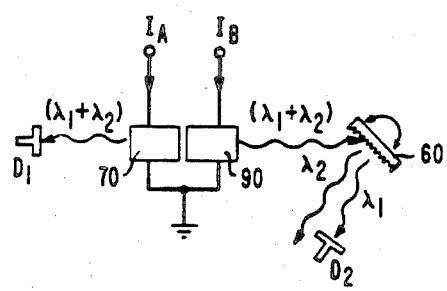
FIGS. 13-14 illustrate embodiments suitable for optical logic devices.
Figure 14:
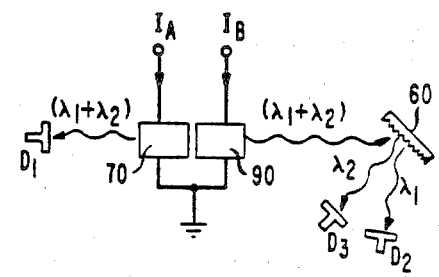

FIGS. 13 and 14 show schematic representations of embodiments suitable for optical logic circuits. In FIG. 13, there is shown a first laser cavity 70, a second laser cavity 90, grating 60, and detectors $D_1$ and $D_2$. Grating 60 may be rotated as indicated by the arrow so that radiation at a wavelength of either $\lambda_1$ or $\lambda_2$ may be detected by detector $D_2$. Detector $D_1$ is sensitive to radiation of wavelengths $\lambda_1$ and $\lambda_2$. The embodiment depicted in FIG. 14 is similar to that of FIG. 13 except that it additionally comprises photodetector $D_3$ and grating 60 does not rotate but directs radiation of wavelengths $\lambda_1$ and $\lambda_2$ to detectors $D_2$ and $D_3$, respectively. The gratings may be any conventional grating structure. Detector $D_2$ and detector $D_3$ are sensitive to radiation of wavelengths $\lambda_1$ and $\lambda_2$, respectively. More than two different wavelengths can also be produced and the detection apparatus modified to detect the additional wavelengths. In both embodiments, cavities 70 and 90 have currents $I_A$ and $I_B$, respectively, flowing through them. The cavities correspond to laser diode sections 3 and 5 of FIGS. 1 and 2.

The operation of the optical logic circuits may now be understood. Assume that both cavity 70 and cavity 90 have a constant dc bias applied to them. If either cavity 70 or 90 now receives a pulse that raises that cavity above the lasing threshold, an optical output will be detected at detector $D_1$, thereby forming the OR function. When cavities 70 and 90 are pulsed simultaneously above the respective lasing thresholds, radiation of wavelength $\lambda_1$ will be detected at detector $D_2$, thereby forming the AND function. If both cavities are not above threshold, no radiation will be detected at $D_2$. Adding yet another photodetector as shown in FIG. 14 permits radiation of wavelength $\lambda_2$ to be detected and thereby permits the exclusive OR operation to be performed. As will be readily appreciated by those skilled in the art, embodiments capable of performing all the logic functions are readily formed by devices according to this invention. These devices rely on the observation that optical beams at different wavelengths can be produced by applying different currents as shown in FIG. 12.

Figure 15:
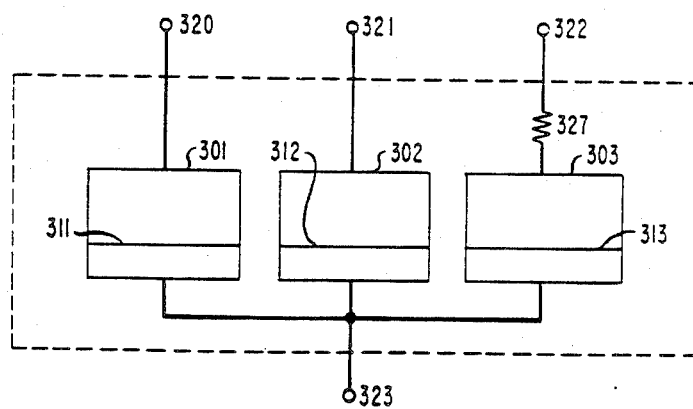
FIG. 15 is a schematic representation of yet another embodiment of this invention.

Still another embodiment of this invention is depicted in FIG. 15. This device comprises laser diode sections 301, 302, and 303 which have active stripes 311, 312, and 313, respectively. The sections are contacted electrically by electrodes 320, 321, and 322, respectively. Additionally, there is a common electrical contact 323 to all three sections. Sections 302 and 303 function as previously described, i.e., a coupled cavity producing a single longitudinal mode output, while section 301 functions as a photodetector. This structure can be made as previously described and as a result, the photodetector is precisely aligned with the active stripe of the laser diodes. This results in extremely efficient optical coupling between the laser diode coupled cavities and permits close monitoring and control of the laser output power. Light from the front face of the coupled cavities is coupled into the optical fiber for transmission and all light from the back face of the coupled cavities is incident on the photodetector. The resulting signal from the photodetector is used as a feedback to control the injection current into the coupled cavities so that the average power launched into the front face of the fiber is maintained at an approximately constant value as a function of time, i.e., all optical pulses have the same intensity.

The diode section operating as the photodiode may be either unbiased or reverse biased.

Several advantages result from this configuration. First, the optical beam from the laser back face is coupled into the photodiode with a high degree of efficiency because of the precise alignment and small separation of the active stripes. Second, the use of index waveguiding in all diode sections and the small separation reduces erroneous photodiode signal feedback due to beam wandering. Third, light coupled into the active stripe of the photodetector is guided by the built-in index waveguiding and because the absorbing waveguide can be made long for essentially complete absorption, the resulting photon-carrier conversion is very efficient. One could even consider this as a waveguiding photodetector in contrast to the more conventional broad area of photodiodes which have an absorbing layer of thickness less than approximately 2 $\mu$m. Other advantages will be readily thought of by those skilled in the art.

Still other embodiments will be readily thought of by those skilled in the art. For example, the coupled cavity device, either a two section or a three section device, may be placed in an external optical cavity and optically aligned with respect to this external optical cavity. Very short optical pulses, typically less than 1 nsec, can be then generated and turned on and off thereby conveying information by adjusting at least one of the currents to one of the laser diode sections.

Figure 16:
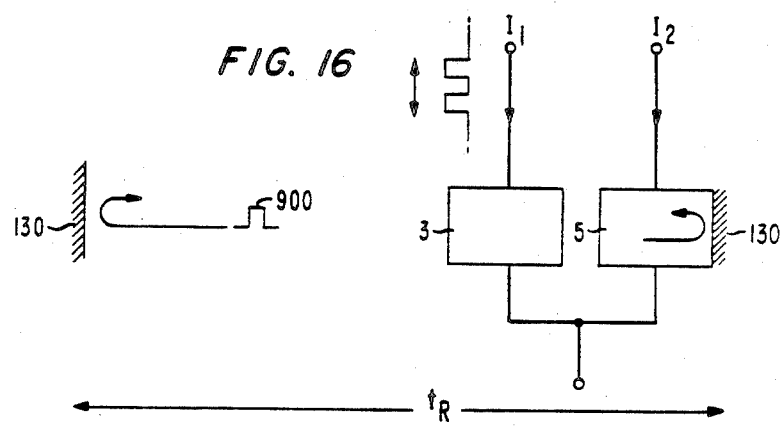
FIG. 16 is a schematic representation of an embodiment of this invention having two diode sections placed in an external cavity.

This may be better understood by reference to FIG. 16. Depicted are diode sections 3 and 5 which are in an external cavity formed by mirrors 130. Currents $I_1$ and $I_2$ pass through diode sections 3 and 5, respectively. Section 3 acts as a laser and section 5 acts as an electrically controlled optical absorber. Section 3 is pulsed electrically, as shown, with a period, $t_R$, in synchronization with the round trip transit time, $t_R$, of the optical pulse 900 in the external cavity. Section 5 is biased below threshold so that the optical absorption level can be varied according to the level of electrical pumping. If section 5 is rapidly pulsed to a high current level, the optical absorption is suddenly decreased and it becomes transparent. This permits a short pulse to leave the cavity and permits information to be conveyed by the mode locked pulses.

Figure 17:
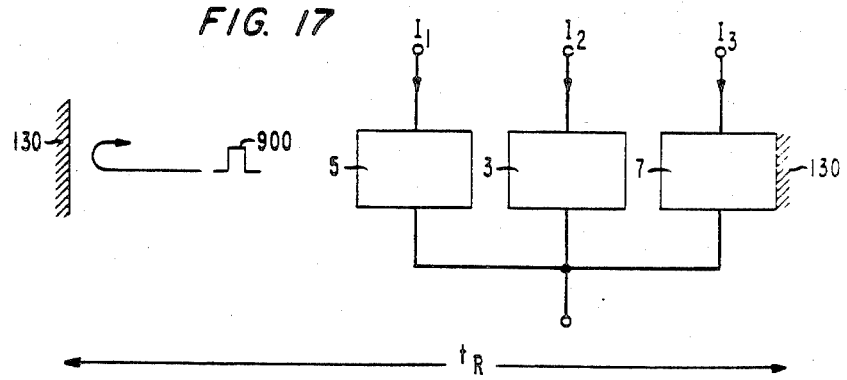
FIG. 17 is a schematic representation of yet another embodiment of this invention having three diode sections placed in an external cavity.

The embodiment depicted in FIG. 17 is the same as that of FIG. 16 with the addition of a third diode section 7. The third diode section acts as a gate for intelligently coding information on the short mode-locked pulses, i.e., a gate that opens or closes the cavity. Section 3 acts as the laser diode and section 5 acts as the electrically controllable saturable optical absorber.

These embodiments may be varied. For example, the external mirror can be a dispersive reflector rather than a nondispersive mirror for single frequency operation and the roles of the several diodes may be interchanged.

Figure 18:
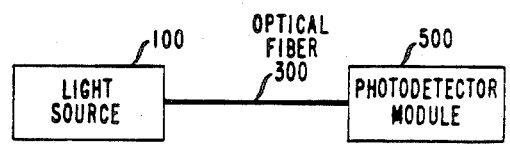
FIG. 18 is a schematic representation of an optical communications system according to this invention.

As will be readily appreciated by those skilled in the art, the value of optical communications systems is greatly enhanced by the inclusion of lasers according to my invention. Such a system is schematically depicted in FIG. 18. Depicted are a cleaved coupled cavity laser which is the light source 100, an optical fiber 300, and a photodetector module 500. The light source 100 and photodetector module 500 are optically coupled to each other by means of the optical fiber 300. The optical fiber may comprise a silica-based optical fiber. As will be appreciated, the narrow spectral output of the laser permits the optical fiber to be constructed without considering the problems associated with material and waveguide dispersion; in other words, the fiber may be optimized for loss. The single mode laser enables the system to use a fiber that could not be used with a multimode laser to result in a given bit rate and interrepeater spacing. That is, the fiber has dispersion properties whereby the laser permits higher bit rates. A second single mode laser may also be used in a wavelength multiplexing system at a higher bit rate than possible with a multimode laser. The structure of the photodetector module will be readily understood by those skilled in the art. For a system operating at a single frequency, it comprises a photodetector. For a system operating at more than one frequency, it comprises at least one photodetector and may further comprise a wavelength dispersive element.

Additionally, it will be readily appreciated that parallel arrays of the coupled cavity configurations described may be easily fabricated. Such an array would be useful in, for example, optical recording systems. Furthermore, the various mirrors may be coated with thin films of a dielectric or metallic nature to alter the reflectivities or spectral selectivity of the mirrors. Still other variations and embodiments will be readily thought of by those skilled in the art.

What is claimed is:

1. A method for forming a plurality of semiconductor sections electrically isolated from each other but optically coupled with each other comprising the steps of depositing a plastically deformable metallic film on a portion of a surface of a semiconductor body, said film being less than 10 $\mu$m thick; scribing said semiconductor body on a surface opposite said film; and bending said semiconductor body thereby cleaving said body along crystallographic planes to form a plurality of semiconductor sections held together by said film.

* * * * *